(12) United States Patent
Chen et al.

(10) Patent No.: US 11,287,754 B2
(45) Date of Patent: *Mar. 29, 2022

(54) MASK BLANK FOR LITHOGRAPHY AND METHOD OF MANUFACTURING THE SAME

(71) Applicant: TAIWAN SEMICONDUCTOR MANUFACTURING CO., LTD., Hsinchu (TW)

(72) Inventors: Ming-Wei Chen, Hsinchu (TW); Hsin-Chang Lee, Zhubei (TW); Ping-Hsun Lin, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/129,841

(22) Filed: Dec. 21, 2020

(65) Prior Publication Data

US 2021/0232055 A1 Jul. 29, 2021

Related U.S. Application Data

(63) Continuation of application No. 16/573,861, filed on Sep. 17, 2019, now Pat. No. 10,871,721.

(60) Provisional application No. 62/739,023, filed on Sep. 28, 2018.

(51) Int. Cl.
  *G03F 7/20* (2006.01)

(52) U.S. Cl.
  CPC .................. *G03F 7/70925* (2013.01)

(58) Field of Classification Search
  CPC ................................................ G03F 7/70925
  See application file for complete search history.

(56) References Cited

U.S. PATENT DOCUMENTS

| | | | |
|---|---|---|---|
| 8,796,666 | B1 | 8/2014 | Huang et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 9,618,837 | B2 | 4/2017 | Lu et al. |
| 9,869,928 | B2 | 1/2018 | Huang et al. |
| 9,869,934 | B2 | 1/2018 | Huang et al. |

(Continued)

OTHER PUBLICATIONS

Non-Final Office Action issued in U.S. Appl. No. 16/573,861 dated Mar. 11, 2020.

(Continued)

*Primary Examiner* — Steven Whitesell Gordon
(74) *Attorney, Agent, or Firm* — McDermott Will & Emery LLP

(57) ABSTRACT

A mask for cleaning a lithography apparatus includes a mask substrate and a coating provided on a surface of the mask substrate. The coating is configured to trap particulate contaminant matter from the lithography apparatus. A method of cleaning a lithography tool is also provided preparing a cleaning mask including a particle trapping layer formed on a substrate. The method includes transferring the cleaning mask through a mask transferring route of the lithography tool. Subsequently, the method includes analyzing a particle trapped by the particle trapping layer.

20 Claims, 7 Drawing Sheets

(56) References Cited

U.S. PATENT DOCUMENTS

| | | |
|---|---|---|
| 9,869,939 B2 | 1/2018 | Yu et al. |
| 10,871,721 B2 * | 12/2020 | Chen .......................... G03F 1/44 |
| 2008/0152873 A1 * | 6/2008 | Okoroanyanwu ..... B82Y 10/00 |
| | | 428/195.1 |
| 2011/0159440 A1 | 6/2011 | Nakajima et al. |
| 2013/0247935 A1 | 9/2013 | Park |
| 2014/0226136 A1 * | 8/2014 | Gagnon .................... G03F 1/82 |
| | | 355/30 |
| 2014/0268074 A1 | 9/2014 | Chien et al. |
| 2015/0160569 A1 | 6/2015 | Osorio Oliveros |
| 2019/0129300 A1 | 5/2019 | Ono et al. |

OTHER PUBLICATIONS

Final Office Action issued in U.S. Appl. No. 16/573,861 dated Jul. 16, 2020.
Notice of Allowance issued in U.S. Appl. No. 16/573,861 dated Sep. 25, 2020.

* cited by examiner

US 11,287,754 B2

MASK BLANK FOR LITHOGRAPHY AND METHOD OF MANUFACTURING THE SAME

CROSS-REFERENCE TO RELATED APPLICATION

The present application is a continuation Application of U.S. patent application Ser. No. 16/573,861 filed on Sep. 17, 2019, which claims priority to U.S. Provisional Application 62/739,023 filed on Sep. 28, 2018, the entire disclosure of which is incorporated herein by reference.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
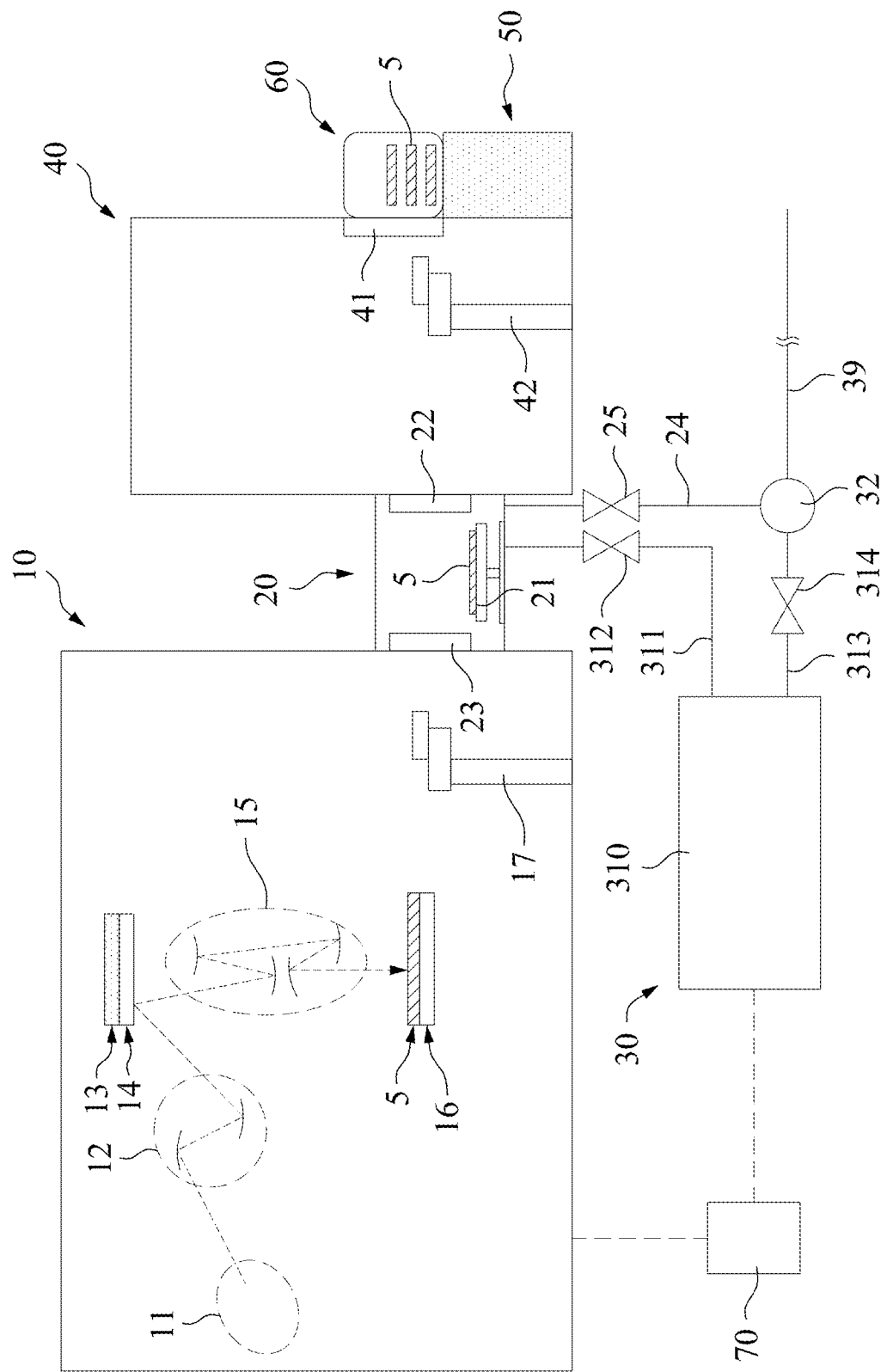
FIG. 1 shows a schematic view of a semiconductor wafer processing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

In EUV photolithography, contaminant particles can reduce the yield of the lithography by undesirably shielding portions of a mask pattern. It is, therefore, desirable to maintain a clean environment in locations and routes where masks pass through during the lithography process such as tool grippers, chambers, mask holders, etc. in particular, the ability to produce high quality microelectronic devices and reduce yield losses is dependent upon maintaining the surfaces of critical components substantially defect-free. This would include maintaining the surfaces free of particulate matter, e.g., maintaining an ultra-clean surface ensuring that particulate matter is not deposited on the surface of the wafer, the reticle or mask or other critical components. This is of particular concern as finer features are required on the microelectronic device. The types of particulate matter can be any arbitrary combination depending on the environment and the vacuum condition. The particulate matter could be introduced from such as etching byproducts in the mask making process, organic hydrocarbon contaminants, any kind of fall-on dust, outgassing from steel, and so on.

Photolithographic equipment is cleaned using a vacuum and an isopropyl alcohol/ethanol wipe-down, and particle counters are used to monitor and verify cleanliness. However, such manual cleaning may not be preferable to vacuum chambers. Moreover, wipe-down and/or vacuum cleaning of delicate or small components is not desirable. Additionally, these procedures are not specific to locations and routes through which masks would pass or potentially get contaminated. Thus, alternate methods of maintaining cleanliness of locations and routes through which masks pass is desirable.

The present disclosure relates to a photomask that is designed to trap particulate matter to improve cleanliness of locations and routes through which photo masks pass. In an aspect of the present disclosure, a surface of a mask blank or surface properties of a mask blank are modified to make the mask blank trap particulate matter.

The mask blank, as used herein, refers to a photo mask or photo mask blank, or a glass plate having the same size as a photo mask.

FIG. 1 is a schematic view of a semiconductor wafer processing system, in accordance with some embodiments. In some embodiments, the semiconductor wafer processing system includes a processing apparatus 10, a load lock chamber 20, a pressure adjusting module 30, an interface module 40, one or more load ports 50, one or more carriers 60, and a controller 70, in accordance with some embodiments. It should be appreciated that the features described below can be replaced or eliminated in other embodiments of the semiconductor wafer processing system.

In some embodiments, the processing apparatus 10 includes a high-brightness light source 11, an illuminator 12, a mask stage 13, a mask 14, a projection optics module 15, a substrate stage 16, and a wafer transfer member 17, in accordance with some embodiments. The elements of the processing apparatus 10 can be added to or omitted, and the invention should not be limited by the embodiment.

The high-brightness light source 11 is configured to generate radiation having a wavelength ranging between about 1 nm and about 10 nm. In one particular example, the high-brightness light source 11 generates an EUV light with a wavelength centered at about 13.5 nm. Accordingly, the high-brightness light source 11 is also referred to as an EUV light source. However, it should be appreciated that the high-brightness light source 11 should not be limited to emitting EUV light. The high-brightness light source 11 can be utilized to perform any high-intensity photon emission from excited target material.

In various embodiments, the illuminator 12 includes various refractive optic components, such as a single lens or a lens system having multiple lenses (zone plates) or alternatively reflective optics (for EUV lithography system), such as a single mirror or a mirror system having multiple mirrors in order to direct light from the high-brightness light source 11 onto a mask stage 13, particularly to a mask 14 secured on the mask stage 13. In the present embodiment where the high-brightness light source 11 generates light in the EUV wavelength range, reflective optics is employed.

The mask stage 13 is configured to secure the mask 14. In some embodiments, the mask stage 13 includes an electrostatic chuck (e-chuck) to secure the mask 14. This is because the gas molecules absorb EUV light and the lithography system for the EUV lithography patterning is maintained in a vacuum environment to avoid EUV intensity loss. In the present disclosure, the terms mask, photomask, and reticle are used interchangeably.

In the present embodiment, the mask 14 is a reflective mask. One exemplary structure of the mask 14 includes a substrate with a suitable material, such as a low thermal expansion material (LTEM) or fused quartz. In various examples, the LTEM includes $TiO_2$ doped $SiO_2$, or other suitable materials with low thermal expansion. The mask 14 includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 14 may further include a capping layer, such as ruthenium (Ru), disposed on the ML for protection. The mask 14 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The projection optics module (or projection optics box (POB)) 15 is configured for imaging the pattern of the mask 14 onto a semiconductor wafer 5 secured on a substrate stage 16 of the processing apparatus 10. In some embodiments, the POB 15 has refractive optics (such as for a UV lithography system) or alternatively reflective optics (such as for an EUV lithography system) in various embodiments. The light directed from the mask 14, carrying the image of the pattern defined on the mask, is collected by the POB 15. The illuminator 12 and the POB 15 are collectively referred to as an optical module of the processing apparatus 10.

The wafer transfer member 17 is configured to deliver the semiconductor wafer 5 from one location within the processing apparatus 10 to another. For example, the semiconductor wafer 5 located in the load lock chamber 20 is transferred to the substrate stage 16 by the wafer transfer member 17. A radial and rotational movement of the wafer transfer member 17 can be coordinated or combined in order to pick up, transfer, and deliver the semiconductor wafer 5.

In the present embodiment, the semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 5 may be a silicon-on-insulator (SOI) or a germanium-on-insulator (GOI) substrate.

In addition, the semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the semiconductor wafer 5 is coated with a resist layer that is sensitive to the EUV light in the present embodiment. Various components including those described above are integrated together and are operable to perform lithography exposing processes.

It should be appreciated that while the processing apparatus 10 is a lithography module, the embodiments of the disclosure should not be limited thereto. The processing apparatus 10 may be configured to perform any manufacturing procedure on a semiconductor wafer 5. For example, the processing apparatus 10 may be configured to perform manufacturing procedures that include deposition processes such as physical vapor deposition (PVD), chemical vapor deposition (CVD), plasma-enhanced chemical vapor deposition (PECVD) and/or other deposition processes. Alternatively, the processing apparatus 10 may be configured to perform manufacturing procedures that include etching processes such as wet etching, dry etching or ion beam milling. Also, the processing apparatus 10 may be configured to perform manufacturing procedures that include lithographic exposure, ion implantation, thermal processes, cleaning processes, testing, any procedure involved in the processing of the semiconductor wafer 5, and/or any combination of such procedures.

The load lock chamber 20 is arranged between the processing apparatus 10 and the interface module 40. The load lock chamber 20 is configured for preserving the atmosphere within the processing apparatus 10 by separating it from the interface module 40. In some embodiments, the load lock chamber 20 includes a wafer stage 21, an external door 22 and an interior door 23. When the semiconductor wafer 5 is inserted into the load lock chamber 20, the semiconductor wafer 5 is placed on the wafer stage 21, and the external door 22 and the interior door 23 are sealed. As a result, an air-tight environment is built in the load lock chamber 20.

The load lock chamber 20 is capable of creating an atmosphere compatible with the processing apparatus 10 or the interface module 40 depending on where the loaded semiconductor wafer 5 is scheduled to be next. This can be performed by altering the gas content of the load lock chamber 20 by adding gas or creating a vacuum, along with other suitable means, using such mechanisms as the pressure adjusting module 30, for adjusting atmosphere in the load lock chamber 20. When the correct atmosphere has been reached, the semiconductor wafer 5 can be accessed.

The pressure adjusting module 30 is configured to reduce the pressure of gas in the load lock chamber 20. In some embodiments, the pressure adjusting module 30 includes a gas tank 310 and a pumping assembly 32. In some embodiments, the volume of the gas tank 310 is greater than the volume of a space defined in the load lock chamber 20 for receiving the semiconductor wafer 5. In some embodiments, the volume of the gas tank 310 is about 15 to about 20 times the volume of the load lock chamber 20. As such, a pressure drop occurs in the load lock chamber 20, when a low pressure gas is contained in the gas tank 310 and an exchange of gas between the gas tank and the load lock chamber 20 is enabled.

In some embodiments, the gas tank 310 is connected to the load lock chamber 20 via the gas line 311. A valve 312 is positioned on the gas line 311 for controlling the flow of gas in the gas line 311. In addition, the gas tank 310 is connected to the pumping assembly 32 via the gas line 313. A valve 314 is positioned on the gas line 313 for controlling the flow of gas in the gas line 313. Moreover, the pumping assembly 32 is connected to the load lock chamber 20 via a gas line 24. A valve 25 is connected to the gas line 24 for controlling the flow of gas in the gas line 24.

In some embodiments, the interface module 40 is a facility interface. In some embodiments, the load port 50 is adjacent to the interface module 40. In some embodiments, an overhead hoist transport (OHT) (not shown) transports the carrier 60, such as a standard mechanical interface (SMIF) or a front opening unified pod (FOUP) with the semiconductor wafer 5 from a stocker (not shown) to the load port 50.

In some embodiment, the interface module 40 includes a wafer transfer member 42 for delivering the semiconductor wafer 5 from one location within the processing interface module 40 to another. For example, when the carrier 60 is located on the load port 50, the semiconductor wafer 5 in the carrier 60 is transferred to the load lock chamber 20 by the wafer transfer member 42. A radial and rotational movement of the wafer transfer member 42 can be coordinated or combined in order to pick up, transfer, and deliver the semiconductor wafer 5.

The controller 70 is configured to control the operation of the semiconductor wafer processing system 1. In some embodiments, the controller 70 includes a computer integrated manufacturing (CIM) host and is electrically connected to all elements of the semiconductor wafer processing system 1. For example, the controller 70 is electrically connected to the pumping assembly 32, the valve 25 and the valves 312 and 314 of the pressure adjusting module 30 and controls the operation of the pumping assembly 32, the valve 25 and the valves 312 and 314 of the pressure adjusting module 30.

In order to transfer the semiconductor wafer 5 into the load lock chamber 20, the exterior door 22 is opened, and the interior door 23 is closed to isolate the load lock chamber 20 from other components of the processing apparatus 10. Afterwards, the semiconductor wafer 5 is inserted into the load lock chamber 20 through the exterior door 22 and placed on the wafer stage 21. After the semiconductor wafer 5 is placed in the load lock chamber 20, the exterior door 22 is closed to isolate the load lock chamber 20 from the interface module 40. As a result, an air-tight environment is maintained in the load lock chamber 20.

Figure 2A:
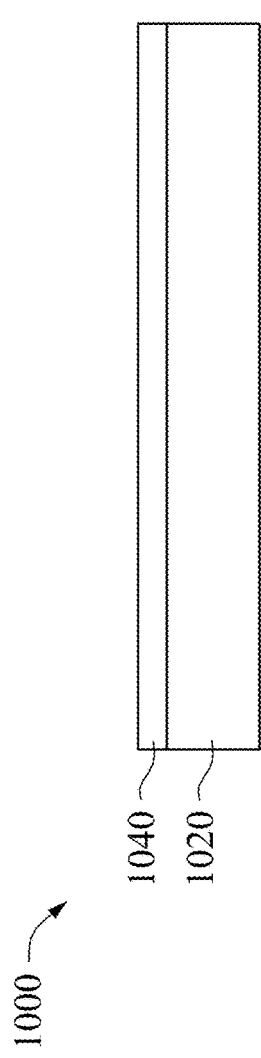
FIGS. 2A and 2B illustrate schematic cross sectional views of a mask blank according to some embodiments of the present disclosure.

FIG. 2A illustrates a schematic cross sectional view of a cleaning mask 1000 according to some embodiments of the present disclosure. In some embodiments, at least the surface of the mask blank 1020 is coated with a nano-fiber network 1040 that can increase or decrease the electron affinity of the coating surface, as shown in FIG. 2A.

Figure 2B:
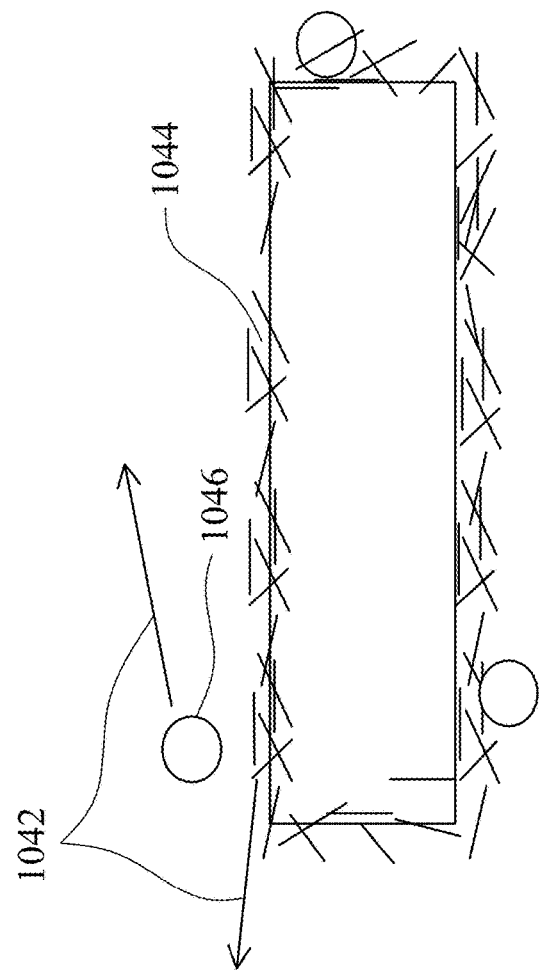

FIG. 2B schematically illustrates a mask blank in accordance with an embodiment of the present disclosure. In some embodiments, an entirety of the cleaning mask 1000 is coated with the nano-fiber network 1040 including nanotubes, nanorods or nano-wires. The nano-fiber network 1040 are made of a material selected from the group consisting of carbon nanotubes and titanium oxide and zinc oxide nanowires.

In some embodiments, the nano-fiber network 1040 can be functionalized with particularly designed (or chosen) functional groups to modify the properties of the nano-fiber network 1040 of the surface of the mask blank 1020. In some embodiments, the nano-fiber network 1040 can be functionalized to increase van der Waals' interaction 1042 between a coating 1044 and particulate contaminants 1046 as shown in FIG. 2B.

In some embodiments, the nano-fiber networks 1040 are synthesized by heating using a furnace or hydrothermal method. In such embodiments, the as-grown nanotubes are then uniformly dispersed into a solution by a centrifuge. The size of the distribution and the density can be controlled by adjusting the solution and/or the speed and time of the centrifuge.

The present disclosure relates to substrates with any dimensions used in the EUV process. The substrate materials are suitable materials such as a low thermal expansion glass material, including titanium oxide doped silicon dioxide, or any other suitable low thermal expansion materials such as quartz, silicon, and silicon carbide. In some embodiments, other low thermal expansion substances include substrates that minimize the image distortion due to mask heating in the EUV photolithographic environment. In some embodiments, the substrate is provided with a hardmask layer including, one or more of silicon dioxide, silicon nitride, spin-on carbon, spin-on oxide, CrO, CrN, CrON, TaO, TaN, Ru, RuN, RuB, TaB, TaBN, TaBO and their oxynitrides, etc.

Figure 3A:
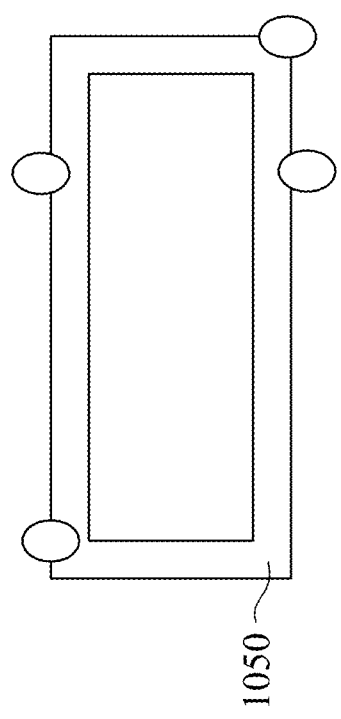
FIGS. 3A and 3B schematically illustrate a mask blank in accordance with an embodiment of the present disclosure.

FIG. 3A schematically illustrates a mask blank in accordance with some embodiments of the present disclosure. In an embodiment, the mask blank is coated with a polymer 1050 such as polydimethyl siloxane (PDMS). In some embodiments, the properties of the nano-fiber network 1040 is modified to make the nano-fiber network 1040, more hydrophobic or hydrophilic. In some embodiments the surface properties of the coating can be modified to make the coating more hydrophobic or hydrophilic, or to increase or decrease the electron affinity of the coating surface.

Figure 3B:
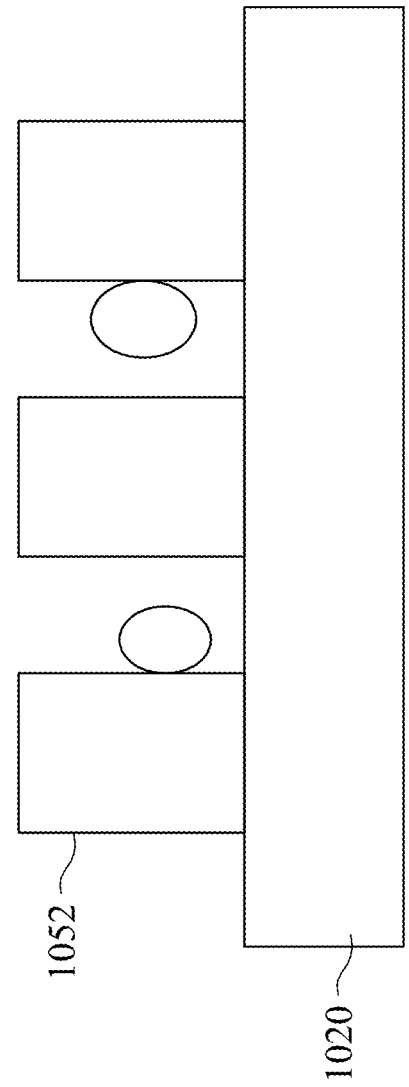

In some embodiments, the polymer coating may be patterned, e.g., in a geometrical pattern designed to trap particulate contaminants. An example of such pattern 1052 is shown in FIG. 3B. In some embodiments, the polydimethyl siloxane (PDMS) is prepared in a mold that has a pattern 1052. After the polydimethyl siloxane (PDMS) is cured in the mold, the polydimethyl siloxane (PDMS) with the pattern is lifted off from the mold to be transferred. Subsequently, the polydimethyl siloxane (PDMS) with the pattern can be transferred to the substrate. Alternatively, the polydimethyl siloxane (PDMS) can be prepared using a dip-coating process. In the dip-coating process, a blank is dip-coated by a polymer solvent. During the drying process, the pattern can be formed by an existing mold stamping.

In an embodiment, a substrate such as a quartz, a low thermal expansion material, or any other substrate that is used for optical or EUV masks, is coated with the polymer or the network of nanotubes, nanorods or nano-wires. The substrate, in various embodiments, may or may not have a backside coating, an absorber, a hardmask or a multilayer reflective layer (such as one used for EUV masks). The mask substrate may or may not have patterns. In other words, the mask substrate may or may not have been processed to form an actual mask.

In some embodiments, the nano-fiber network 1040 forms a mesh structure that can physically trap particles. The mesh structure includes a mesh size (e.g., a diameter or a largest width) in a range from about 1 nm to about 500 nm. In some embodiments, the mesh size ranges between any of the following mesh sizes: 1 nm, 2 nm, 5 nm, 10 nm, 20 nm, 50 nm, 100 nm, 200 nm, and 500 nm. The mesh size depends on a size, a width and a density of the nano-fiber network 1040.

Figure 4A:
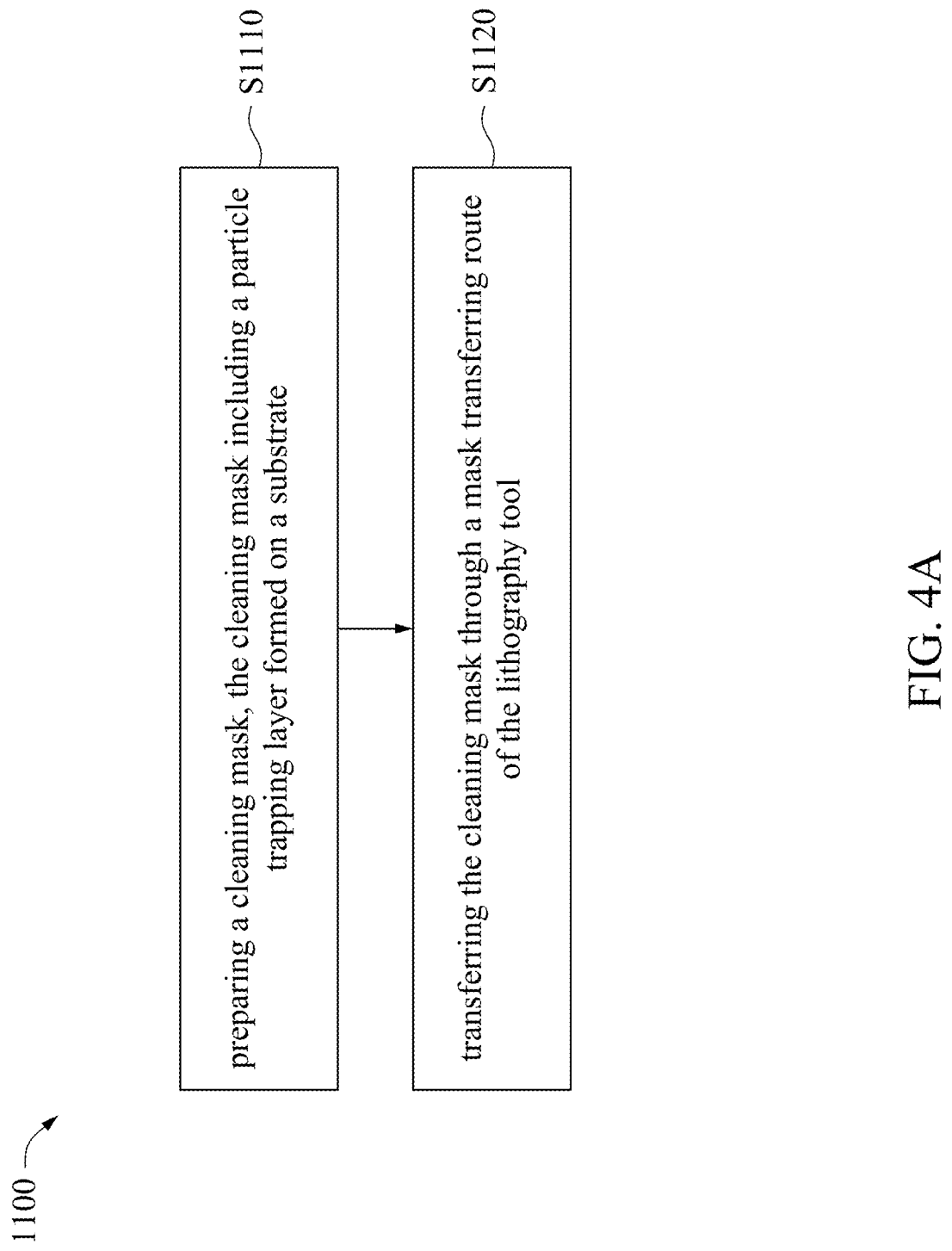
FIG. 4A illustrates a flow chart of a method of cleaning a lithography tool in accordance with some embodiments.

FIG. 4A illustrates a flow chart of a method of cleaning a lithography tool in accordance with an embodiment of the present disclosure. The method includes, at S1110, preparing the cleaning mask 1000. Then, at S1120, the method includes transferring the cleaning mask through a mask transferring route of the lithography tool. The cleaning mask includes a particle trapping layer formed on a substrate. The cleaning mask 1000 can be used in the semiconductor wafer processing system as shown in FIG. 1 with the load lock chamber 20 and/or the wafer transfer member 17. In some embodiments, the particle trapping layer includes nano-fibers. In some embodiments, the nano-fibers include at least one selected from the group consisting of carbon nanotubes, titanium oxide nano-wires, and zinc oxide nan-wires. In some embodiments, the particle trapping layer includes a polymer layer. In some embodiments, the polymer layer includes at least one selected from the group consisting of polydimethyl siloxane, PMMA and epoxy. In some embodiments, the polymer layer is patterned. In other embodiments, the polymer layer is not a photo resist layer.

In some embodiments, the substrate is a quartz substrate or a low thermal expansion material substrate, and the particle trapping layer is formed directly on at least one surface of the quartz substrate. In some embodiments, the substrate is a quartz substrate or a low thermal expansion material substrate and has a patterned surface. In some embodiments, the particle trapping layer is formed on the patterned surface. In some embodiments, the substrate is a quartz substrate or a low thermal expansion material substrate, on which a multi-layered structure is formed, and the particle trapping layer is formed on the multi-layered structure. In some embodiments, the multi-layered structure includes patterns. In some embodiments, the cleaning mask is transferred through the mask transferring route multiple times. In some embodiments, the particle trapping layer is formed on all surfaces of the substrate. In some embodiments, a surface of the particle trapping layer is more hydrophilic than a surface of the substrate. In some embodiments, a surface of the particle trapping layer is less hydrophilic than a surface of the substrate. In other embodiments, a surface of the particle trapping layer has a higher electron affinity than a surface of the substrate. In some embodiments, a surface of the particle trapping layer has a lower electron affinity than a surface of the substrate.

Figure 4B:
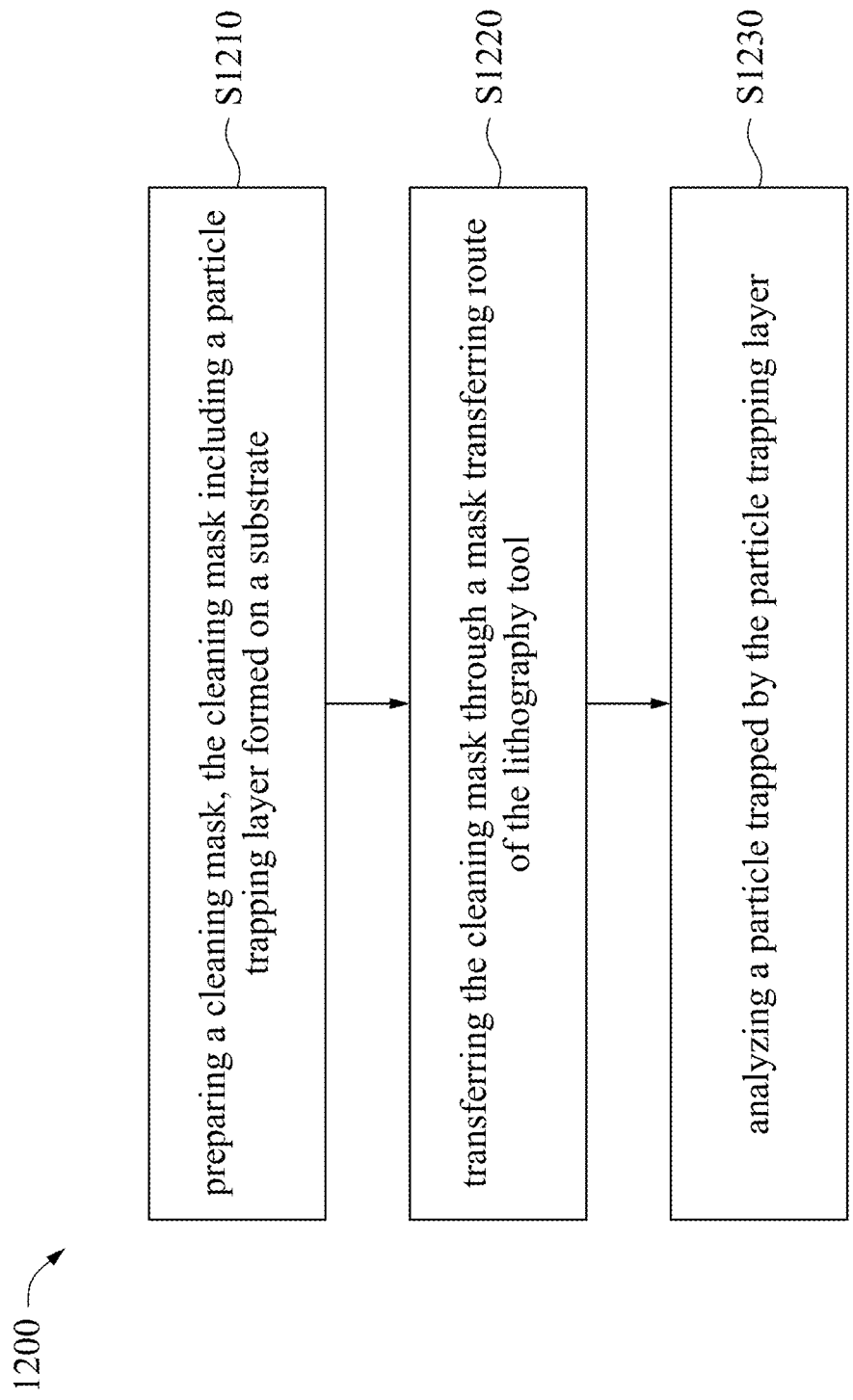
FIG. 4B illustrates a flow chart of a method of cleaning a lithography tool in accordance with other embodiments.

FIG. 4B illustrates a flow chart of a method of cleaning a lithography tool in accordance with another embodiment of the present disclosure. The method includes, at S1210, preparing a cleaning mask. The cleaning mask includes a particle trapping layer formed on a substrate. Then, at S1220, the method includes transferring the cleaning mask through a mask transferring route of the lithography tool. Subsequently, at S1230, the method includes analyzing a particle trapped by the particle trapping layer. In some embodiments, the particle is analyzed by scanning electron microscopy (SEM). In other embodiments, the particle is analyzed by energy dispersive X-ray spectroscopy (EDX), total reflection X-ray fluorescence (TXRF) and/or any suitable method of an elemental analysis. In some embodiments, the method further includes identifying a source of the particle based on the analysis. In other embodiments, the method further includes counting a number of particles before the transferring the cleaning mask. In some alternative embodiments, the method further includes counting a number of particles after the transferring the cleaning mask. In some embodiments, the method further includes cleaning a part of the lithography tool corresponding to the source of the particle. After cleaning the part, in some embodiments, the method further includes transferring the cleaning mask through the mask transferring route and checking if there is a newly trapped particle. In some embodiments, the method includes repeating the cleaning and transferring until a number of trapped particles is smaller than a threshold (or zero).

In some embodiments, the method further includes cleaning the mask transferring route with a first mask with a first material, and cleaning the mask transferring route with a second mask with a second material different from the first material to capture different particles. In some embodiments, the first material is more hydrophilic than the second material. In some embodiments, the first material is less hydrophilic than the second material. In other embodiments, the first material has a higher electron affinity than the second material. In some embodiments, the first material has a lower electron affinity than the second material.

Figure 5:
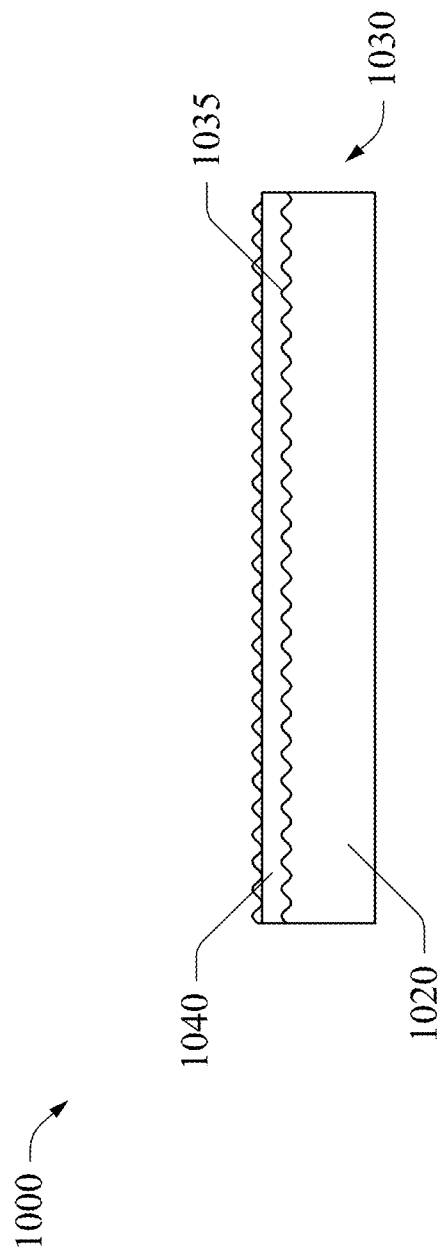
FIG. 5 illustrates a schematic cross sectional view of an alternative mask blank according to some embodiments of the present disclosure.

In some embodiments of the present disclosure, the surface of the mask blank 1020 has a roughened structure 1030 as shown in FIG. 5, and the nano-fiber network 1040 is formed on the roughened surface 1035. The roughened surface 1035 has nano-scale microstructures which are regularly and/or irregularly/randomly arranged.

Figure 6A:
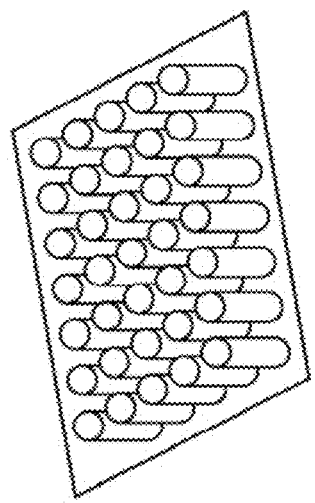
FIGS. 6A, 6B, 6C, and 6D illustrate various surface textures of a mask blank according to some embodiments of the present disclosure.

In some embodiments, as shown in FIG. 6A, the surface of the mask blank 1020 has regularly formed depressions or holes, each of which size (e.g., a diameter or a largest width) is in a range from about 1 nm to about 500 nm. In some embodiments, the size is in a range between any of the following sizes: 1 nm, 2 nm, 5 nm, 10 nm, 20 nm, 50 nm, 100 nm, 200 nm, and 500 nm. The depth of the depressions or holes is in a range from about 5 nm to about 1000 nm in some embodiments. In some embodiments, the depth of the depressions or holes is in a range between any of the following depths: 5 nm, 10 nm, 20 nm, 50 nm, 100 nm, 200 nm, 500 nm, and 1000 nm. The depressions or holes are two dimensionally arranged with a pitch of about 2 nm to about 1000 nm in some embodiments. In some embodiments, the pitch ranges between any of the following pitch sizes: 2 nm, 5 nm, 10 nm, 20 nm, 50 nm, 100 nm, 200 nm, 500 nm, and 1000 nm. The shape of the opening of the depressions or holes may be circular, ellipsoid or polygonal.

Figure 6B:
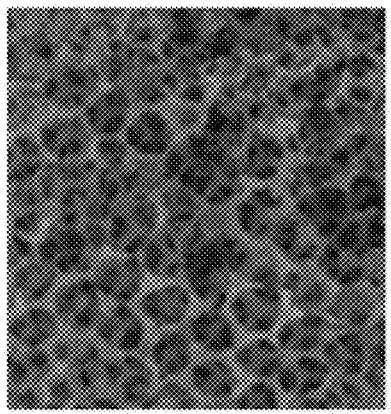

In other embodiments, as shown in FIG. 6B, the surface of mask blank has regularly formed protrusions, each of which size (e.g., a diameter or a largest width) is in a range from about 1 nm to about 500 nm. The height of the protrusions is in a range from about 5 nm to about 1000 nm in some embodiments. The protrusions are two-dimensionally arranged with a pitch of about 2 nm to about 1000 nm in some embodiments. The top shape of the protrusions may be circular, ellipsoid or polygonal. The protrusions may have a columnar, a pyramidal or conical shape.

The regular nano-structure shown in FIGS. 6A and 6B can be formed by suitable patterning operations including lithography and etching operations. The nano-structures may be formed by nano-imprinting technologies.

Figure 6C:
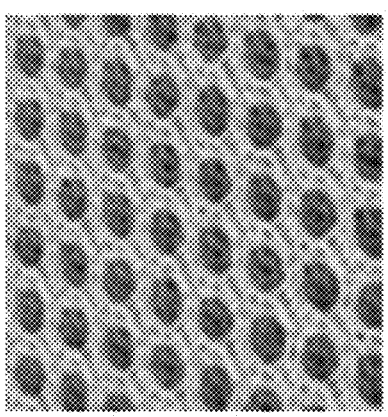

In some embodiments, the surface of mask blank has irregularly formed nano-structures. As shown in FIG. 6C, the surface of mask blank has irregularly formed protrusions, each of which diameter is in a range from about 5 nm to about 500 nm. In some embodiments, the diameter is in a range between any of the following diameters: 5 nm, 10 nm, 20 nm, 50 nm, 100 nm, 200 nm, and 500 nm. The height of the protrusions is in a range from about 5 nm to about 1000 nm in some embodiments. The protrusions may have a columnar, a pyramidal or conical shape. The irregular nano-structures may be formed by a sand blast method, a wet etching method using an acid or alkaline solution, an ion bombardment method or a plasma etching method. The arithmetic average surface roughness Ra of the roughened surface is in a range from about 1 nm to about 500 nm in some embodiments, and in in a range from about 5 nm to about 200 nm in other embodiments. In some embodiments, the arithmetic average surface roughness Ra of the roughened surface is in a range between any of the following surface roughness Ra: 1 nm, 2 nm, 5 nm, 10 nm, 20 nm, 50 nm, 100 nm, 200 nm, and 500 nm.

Figure 6D:
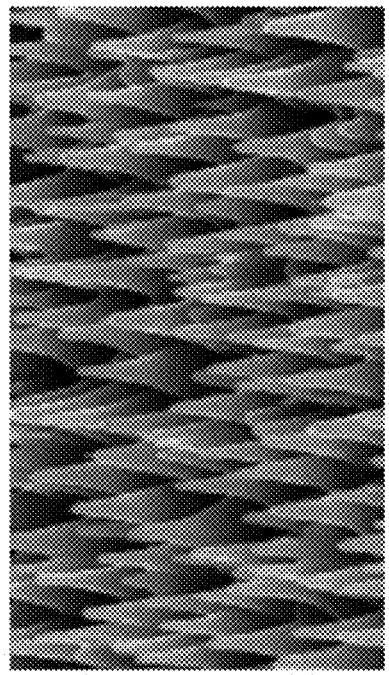

In certain embodiments, the surface of mask blank has a porous structure. As shown in FIG. 6D, the surface of mask blank has a porous structure, and each of the pores has a size in a range from about 5 nm to about 500 nm. The porous structures may be formed by a sand blast method, a wet etching method using an acid or alkaline solution, an ion bombardment method or a plasma etching method. The surface roughness Ra of the roughened surface is in a range from about 1 nm to about 500 nm in some embodiments, and in in a range from about 5 nm to about 200 nm in other embodiments. In some embodiments, the arithmetic average surface roughness Ra of the roughened surface is in a range between any of the following surface roughness Ra: 1 nm, 2 nm, 5 nm, 10 nm, 20 nm, 50 nm, 100 nm, 200 nm, and 500 nm.

In the foregoing embodiments, the surfaces of the mask blank 1020 are directly formed to have nano-structures, and then the catalytic layer is formed on the roughened surface 1035 in some embodiments. In other embodiments, one or more additional layers having nano-structures is formed on the surface of the mask blank 1020 and then the catalytic layer is formed on the one or more additional layers.

In some embodiments, the nano-scale roughened surface 1035 can be formed by depositing nano-scale particles using a thermal deposition method, a physical vapor deposition method, a chemical vapor deposition method and/or a coating method. In other embodiments, a wet treatment or a thermal treatment is performed on the surface of mask blank 1020 to form the nano-scale roughened surface 1035. In certain embodiments, the cleaning mask 1000 includes two or more layers and the layer disposed at the surface of mask blank 1020 are vaporized or sublimated, thereby forming a nano-scale roughened surface 1035. In some embodiments, a sand blasting method is performed to form the nano-scale roughened surface 1035.

By making the surface of mask blank 1020 a nano-scale-roughened surface 1035, it is possible to enlarge a surface area of the nano-fiber network 1040 and thus it is possible to enhance the trapping of particles on the surface of the mask blank 1020.

An embodiment of the disclosure is a method of cleaning a lithography tool. The method includes preparing a cleaning mask. Then, the cleaning mask is transferred through a mask transferring route of the lithography tool. The cleaning mask includes a particle trapping layer formed on a substrate. In some embodiments, the particle trapping layer includes nano-fibers. In some embodiments, the nano-fibers include at least one selected from the group consisting of carbon nanotubes, titanium oxide nano-wires, and zinc oxide nano-wires. In some embodiments, the particle trapping layer includes a polymer layer. In some embodiments, the polymer layer includes at least one selected from the group consisting of polydimethyl siloxane, PMMA and epoxy. In some embodiments, the substrate is a quartz substrate or a low thermal expansion material substrate, and the particle trapping layer is formed directly on at least one surface of the quartz substrate. In some embodiments, the substrate is a quartz substrate or a low thermal expansion material substrate having a patterned surface, and the particle trapping layer is formed on the patterned surface. In some embodiments, the substrate is a quartz substrate or a low thermal expansion material substrate, on which a multi-layered structure is formed, and the particle trapping layer is formed on the multi-layered structure. In some embodiments, the multi-layered structure includes patterns. In some embodiments, the cleaning mask is transferred through the mask transferring route multiple times. In some embodiments, the particle trapping layer is formed on all surfaces of the substrate. In some embodiments, a surface of the particle trapping layer has a different hydrophilicity than a surface of the substrate. In some embodiments, a surface of the particle trapping layer has a different electron affinity than a surface of the substrate.

Another embodiment of the disclosure is a method of cleaning a lithography tool. The method includes preparing a cleaning mask. The cleaning mask includes a particle trapping layer formed on a substrate. Then, the cleaning mask is transferred through a mask transferring route of the lithography tool. Subsequently, the method analyzes a particle trapped by the particle trapping layer. In some embodiments, the method further identifies a source of the particle based on the analysis. In some embodiments, the method counts a number of particles before and after the transferring the cleaning mask. In some embodiments, the method cleans a part of the lithography tool corresponding to the source of the particle. In some embodiments, after cleaning the part, the cleaning mask is transferred through the mask transferring route and checking if there is a newly trapped particle. In some embodiments, the cleaning and transferring are repeated until a number of trapped particles is less than a threshold number.

An embodiment of the disclosure is a cleaning photo mask for an EUV lithography tool. The cleaning photo mask includes a substrate and a particle trapping layer formed on at least one surface of the substrate. The particle trapping layer includes at least one selected from the group consisting of nano-fibers and a polymer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography tool comprising:
a cleaning mask; and
a mask transferring route,
wherein the cleaning mask includes a particle trapping layer formed on a substrate and the particle trapping layer includes nano-fibers forming a mesh structure, and
wherein the particle trapping layer is formed on all surfaces of the substrate.

2. The lithography tool of claim 1, wherein the nano-fibers include at least one selected from the group consisting of carbon nanotubes, titanium oxide nano-wires, and zinc oxide nano-wires.

3. The lithography tool of claim 1, wherein the particle trapping layer includes a polymer layer.

4. The lithography tool of claim 3, wherein the polymer layer includes at least one selected from the group consisting of polydimethyl siloxane, PMMA and epoxy.

5. The lithography tool of claim 1, wherein:
the substrate is a quartz substrate or a low thermal expansion material substrate, and the particle trapping layer is formed directly on at least one surface of the substrate.

6. The lithography tool of claim 1, wherein:
the substrate is a quartz substrate or a low thermal expansion material substrate, having a patterned surface, and
the particle trapping layer is formed on the patterned surface.

7. The lithography tool of claim 1, wherein the mesh structure has a mesh size in a range from 1 nm to 500 nm.

8. The lithography tool of claim 1, wherein further including an analyzing module for analyzing particles trapped by the cleaning mask.

9. An analyzing device, the device comprising:
a cleaning mask including a particle trapping layer formed on a substrate and the particle trapping layer including nano-fibers formed on a roughened surface; and
an analyzing module that performs analysis of a particle trapped by the particle trapping layer,
wherein the analyzing module includes at least one of scanning electron microscopy (SEM), energy dispersive X-ray spectroscopy (EDX), or total reflection X-ray fluorescence (TXRF).

10. The analyzing device of claim 9, wherein the roughed surface comprises regularly arranged microstructures.

11. The analyzing device of claim 10, wherein the regularly arranged microstructures include protrusions, depressions or holes, each of which size is in a range from 1 nm to 500.

12. The analyzing device of claim 9, wherein the roughed surface comprises irregularly arranged microstructures.

13. The analyzing device of claim 12, wherein the irregularly arranged microstructures include protrusions, depressions or holes, each of which size is in a range from 5 nm to 500 nm.

14. The analyzing device of claim 9, wherein an arithmetic average surface roughness Ra of the roughened surface is in a range from 5 nm to 200 nm.

15. A lithography system, comprising:
a controller;
a substrate; and
a particle trapping layer formed on at least one surface of the substrate,
wherein the particle trapping layer includes at least one selected from the group consisting of nano-fibers and a polymer and the nano-fibers form a mesh structure,
the substrate is a quartz substrate or a low thermal expansion material substrate, and
the particle trapping layer is formed directly on at least one surface of the substrate.

16. The lithography system of claim 15, wherein the mesh structure has a mesh size in a range from 1 nm to 500 nm.

17. The lithography system of claim 15, wherein the at least one surface of the substrate includes patterns.

18. The lithography system of claim 16, wherein the substrate is transferred through a mask transferring route multiple times.

19. The lithography system of claim 15, wherein a surface of the particle trapping layer has a different hydrophilicity than a surface of the substrate.

20. The lithography system of claim 15, wherein a surface of the particle trapping layer has a different electron affinity than a surface of the substrate.

* * * * *